(12) United States Patent
Chang et al.

(10) Patent No.: US 8,497,150 B2
(45) Date of Patent: Jul. 30, 2013

(54) METHOD FOR DEFECT ISOLATION OF THIN-FILM SOLAR CELL

(75) Inventors: Yung-Yuan Chang, Houli Township, Taichung County (TW); Hui-Chu Lin, Houli Township, Taichung County (TW)

(73) Assignee: Nexpower Technology Corp., Taichung County (TW)

( * ) Notice: Subject to any disclaimer, the term of this patent is extended or adjusted under 35 U.S.C. 154(b) by 620 days.

(21) Appl. No.: 12/569,024

(22) Filed: Sep. 29, 2009

(65) Prior Publication Data

US 2010/0087025 A1    Apr. 8, 2010

(30) Foreign Application Priority Data

Oct. 7, 2008  (TW) ............................... 97138513 A

(51) Int. Cl.
*H01L 21/00*   (2006.01)
(52) U.S. Cl.
USPC .......... 438/57; 438/4; 438/7; 438/16; 438/58; 438/61; 257/E21.211

(58) Field of Classification Search
None
See application file for complete search history.

(56) References Cited

U.S. PATENT DOCUMENTS

| | | | |
|---|---|---|---|
| 7,989,729 B1 * | 8/2011 | Zhao et al. | 219/121.76 |
| 2009/0077805 A1 * | 3/2009 | Bachrach et al. | 29/890.033 |
| 2010/0084015 A1 * | 4/2010 | Chang et al. | 136/256 |
| 2010/0237895 A1 * | 9/2010 | Chung | 324/766 |

FOREIGN PATENT DOCUMENTS

JP          8037317 A      2/1996

* cited by examiner

*Primary Examiner* — Kyoung Lee
(74) *Attorney, Agent, or Firm* — Ming Chow; Sinorica, LLC

(57) ABSTRACT

This invention discloses a defect isolation method for thin-film solar cell having at least a defect therein. The thin-film solar cell comprises a substrate, a front electrode layer, an absorber layer and a back electrode layer stacked in such a sequence. The defect isolation method includes the steps of: detecting at least a defect formed in thin-film solar cell and acquiring the positions of the defects, and applying a laser light to scribe the outer circumference of the defects according to the positions of the defects so as to form at least an isolation groove having a closed-curve configuration.

7 Claims, 4 Drawing Sheets

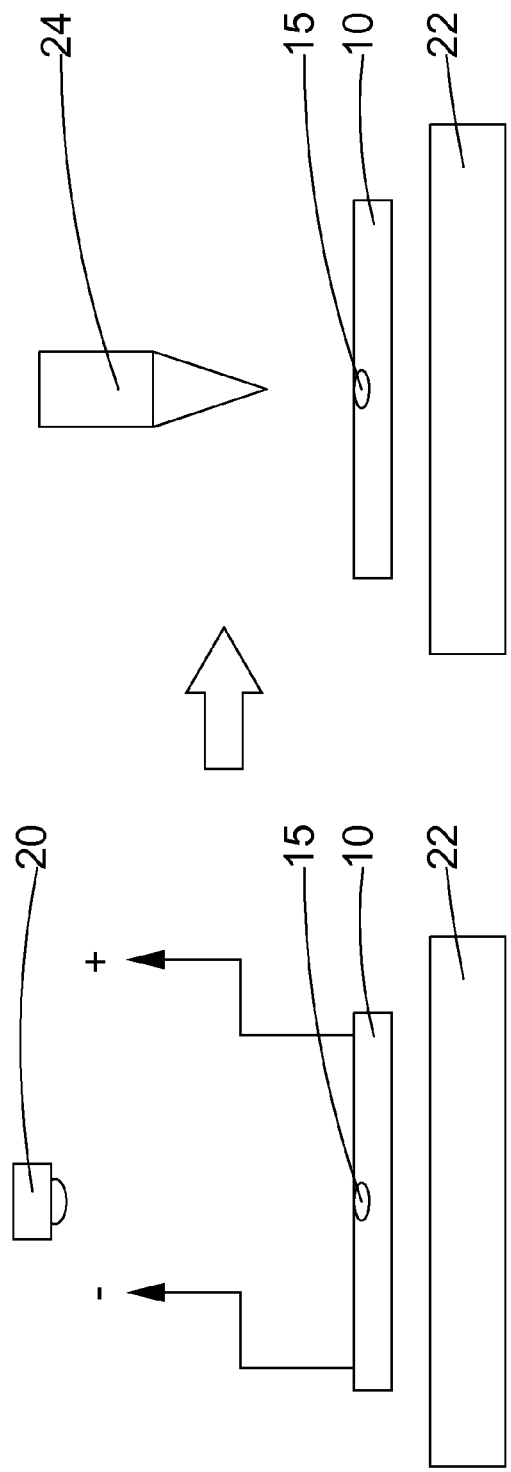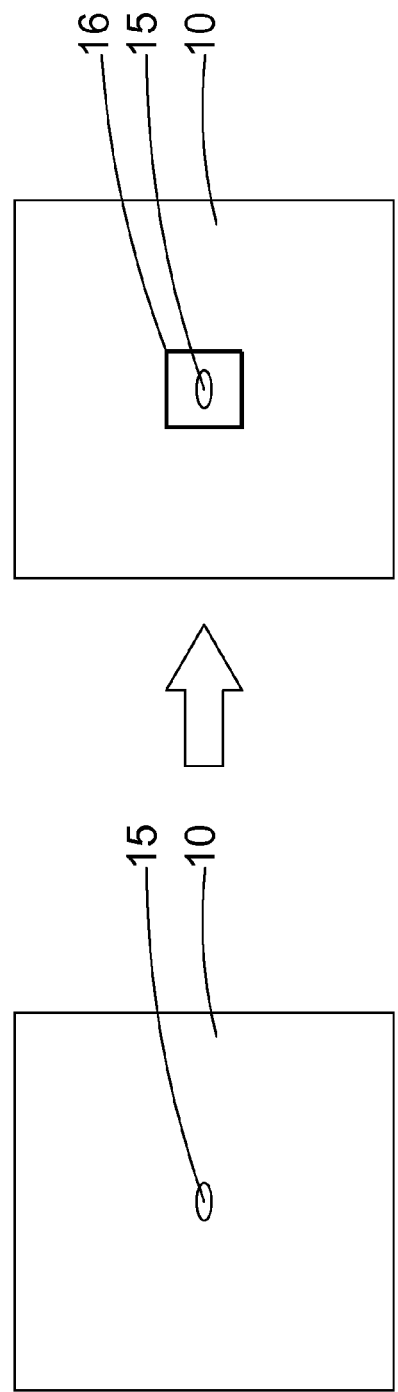
Fig. 1A
Fig. 1B

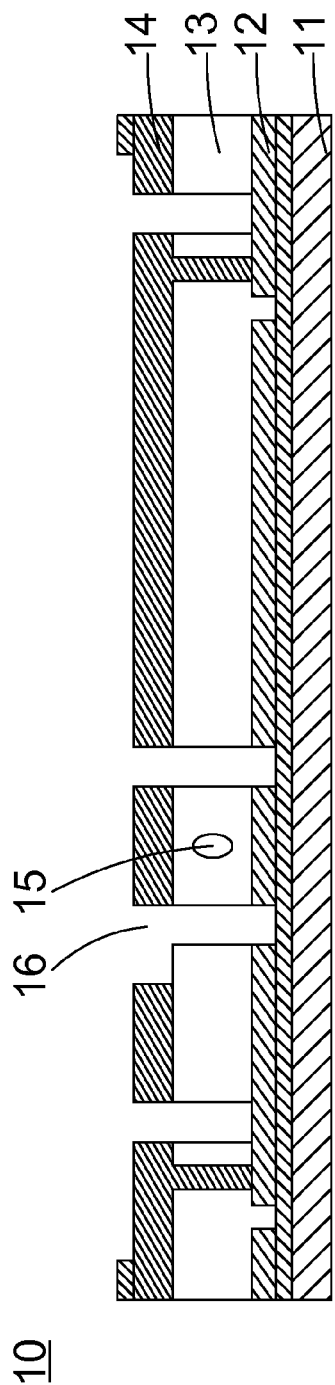
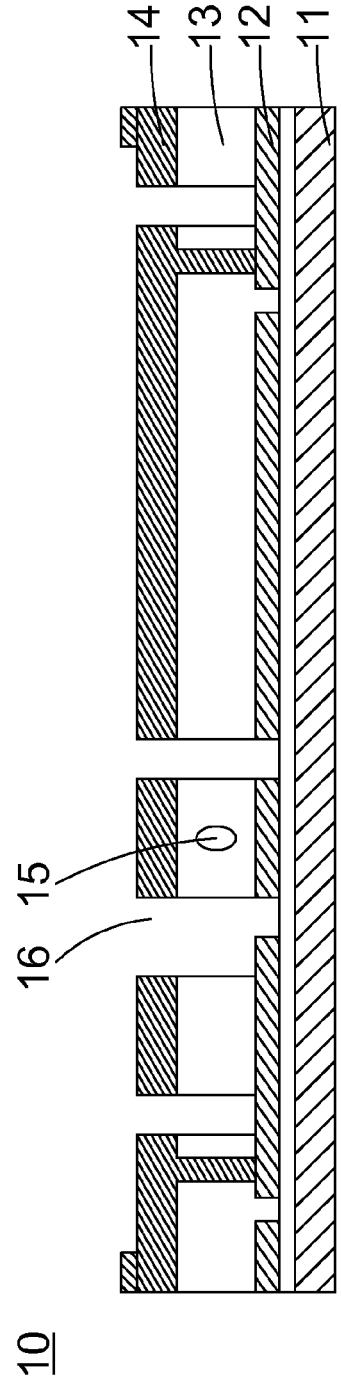
Fig. 3A
Fig. 3B

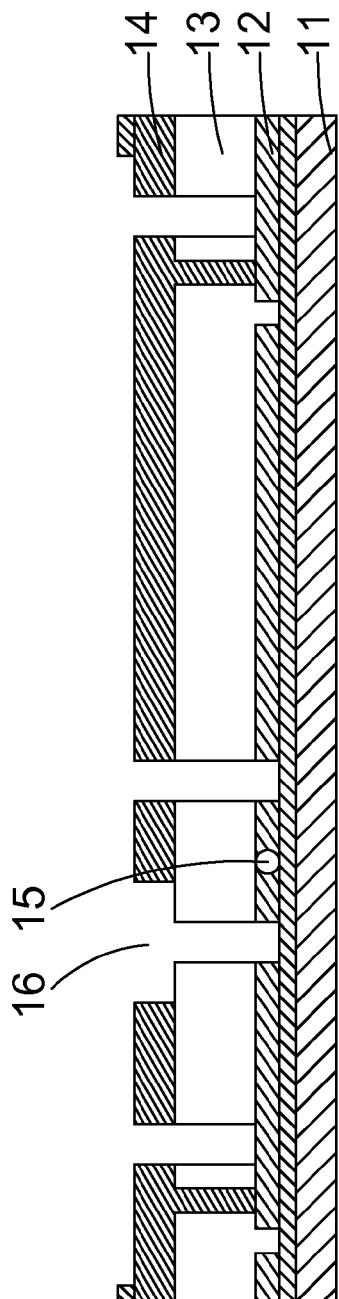
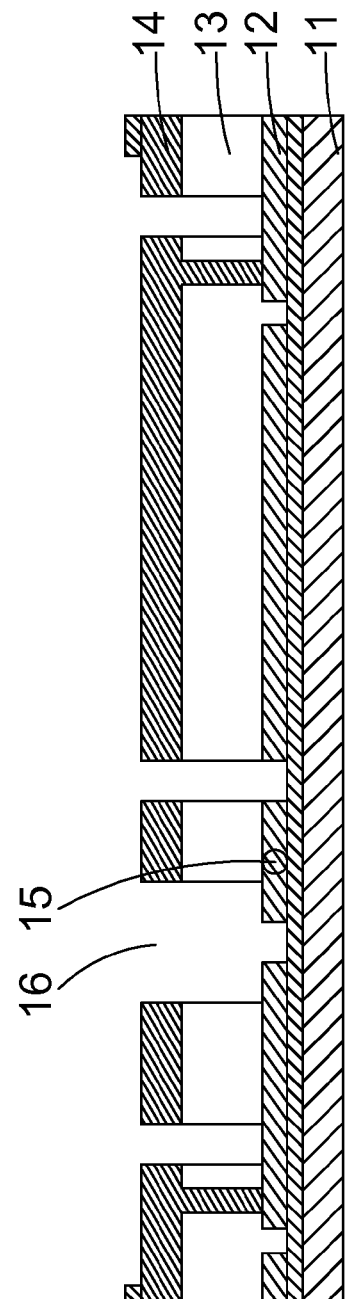

METHOD FOR DEFECT ISOLATION OF THIN-FILM SOLAR CELL

CROSS REFERENCE TO RELATED APPLICATION

This application is an application filed under 35 U.S.C. §111(a) claiming benefit, pursuant to 37 CFR 1.56, of the filing date of the Co-pending application Ser. No. 12/567,987 filed on Nov. 28, 2009, pursuant to 37CFR 1.56.

BACKGROUND OF THE INVENTION

1. Technical Field

The present invention relates to a method for defect isolation of a thin-film solar cell and, more particularly, to a method for applying a laser light to form an isolation groove around a defect of a thin-film solar cell and thereby restraining a short circuit from the defect in the thin-film solar cell.

2. Description of Related Art

Generally, a thin-film solar cell is formed at least of a transparent substrate, a front electrode layer, an absorber layer, and a back electrode layer sequentially stacked up. During the manufacturing process of a thin-film solar cell, the foregoing layers are deposited and laser light cut so as to form a thin-film solar cell with a plurality of unit cells connected in series. While the layers are being laser light cut, any incomplete cut becomes a defect that may short-circuit the finished thin-film solar cell and thus lower the overall power generation efficiency thereof To solve this problem, Japanese Patent Laid-Open Publication No. H8-037317 provides a method for detecting and removing a short-circuiting defect of a thin-film solar cell, wherein the method comprises determining the location of a defect in a back electrode layer by means of infrared thermal image measurement and then removing the defect with pulse laser light according to the location of the defect.

Nevertheless, the prior art cited above leaves much room for improvement in terms of defect removal from thin-film solar cell. More specifically, the prior art is directed essentially to the removal of a short-circuiting defect located in the back electrode layer of a thin-film solar cell. In practice, however, the defect of a thin-film solar cell may occur in places other than the back electrode layer, and the defect may cause problems other than a short circuit. As the absorber layer and the front electrode layer are also susceptible to defects of various forms during the manufacturing process of a thin-film solar cell, the above-cited prior art has its limitations in improving defect removal from thin-film solar cell. Therefore, it is a pressing issue for the related industry to provide more effective defect removal from thin-film solar cell than that furnished by the prior art.

BRIEF SUMMARY OF THE INVENTION

To overcome the aforesaid shortcomings of the prior art, the present invention provides a method for defect isolation of a thin-film solar cell, where the thin-film solar cell has at least a defect that is isolated by means of laser light cutting, mechanical cutting, or chemical etching. The thin-film solar cell comprises a substrate, a front electrode layer, an absorber layer, and a back electrode layer sequentially stacked up. The method includes the steps of: detecting at least a defect of the thin-film solar cell so as to obtain a corresponding location to the defect; and forming at least an isolation groove of a closed-curve configuration around the defect using laser light of a specific wavelength according to the location of the defect. Thus, the isolation groove is formed to restrain the defect from a short circuit in the thin-film solar cell and thereby increases overall power generation efficiency of the thin-film solar cell.

Therefore, it is a primary objective of the present invention to provide a defect isolation method that detects the position of the defect in the back electrode layer of the thin-film solar cell, and subsequently applies one of ultraviolet, green and infrared laser lights to scribe an isolation groove around the position of the defect based on the position of the defect so as to repair the defect due to restraining its short-circuit effect and further to increase the overall power generation efficiency.

It is a second objective of the present invention to provide a defect isolation method that detects the position of the defect in the absorber layer of the thin-film solar cell, and subsequently applies one of green and infrared laser lights to scribe an isolation groove around the position of the defect based on the position of the defect so as to repair the defect due to restraining its short-circuit effect and further to increase the overall power generation efficiency.

It is a third objective of the present invention to provide a defect isolation method that detects the position of the defect in the front electrode layer of the thin-film solar cell, and subsequently applies infrared laser light to scribe an isolation groove around the position of the defect based on the position of the defect so as to repair the defect due to restraining its short-circuit effect and further to increase the overall power generation efficiency.

BRIEF DESCRIPTION OF THE SEVERAL VIEWS OF THE DRAWINGS

The structures and technical means adopted by the present invention to achieve the above and other objectives can be best understood by referring to the following detailed description of the preferred embodiments in conjunction with the accompanying drawings, in which:

FIG. 1A is a schematic side view of a defect isolation equipment for depicting its use in a first preferred embodiment of the present invention;

FIG. 1B is a schematic top view of a thin-film solar cell for depicting a defect before and after isolation according to the first preferred embodiment of the present invention:

FIG. 3A is a schematic sectional view of a thin-film solar cell for depicting an isolated defect according to a third preferred embodiment of the present invention;

FIG. 3B is a schematic sectional view of another thin-film solar cell for depicting an isolated defect according to the third preferred embodiment of the present invention;

FIG. 4A is a schematic sectional view of a thin-film solar cell for depicting an isolated defect according to a fourth preferred embodiment of the present invention; and FIG. 4B is a schematic sectional view of another thin-film solar cell for depicting an isolated defect according to the fourth preferred embodiment of the present invention.

DETAILED DESCRIPTION OF THE INVENTION

Figure 2:
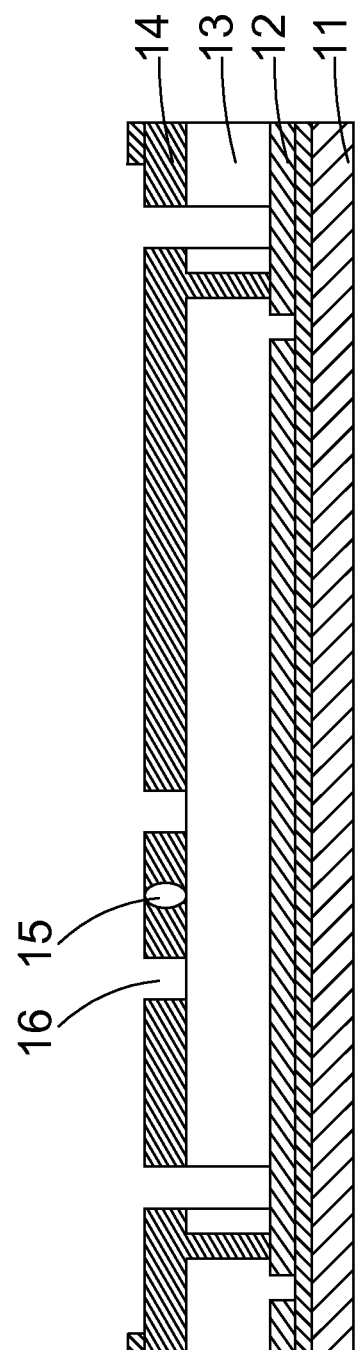
FIG. 2 is a schematic sectional view of a thin-film solar cell for depicting an isolated defect according to a second preferred embodiment of the present invention.

The present invention provides a thin-film solar cell, wherein the principle of photoelectric conversion from solar energy is well known to a person of ordinary skill in the art and therefore will not be detailed herein. Besides, it is to be understood that the drawings referred to in the following description are intended to demonstrate features of the present invention only schematically, so the drawings are not necessarily drawn to scale.

Referred to FIG. 1A and FIG. 1B, it is a method for defect isolation of a thin-film solar cell 10 according to a first preferred embodiment of the present invention, where FIG. 1A is a front view of a defect isolation equipment for depicting how to scribe a closed-curve isolation groove around the defect by means of using laser light, and FIG. 1B is a top view of a thin-film solar cell having a defect. The thin-film solar cell 10 comprises a substrate 11, a front electrode layer 12, an absorber layer 13 and a back electrode layer 14 sequentially stacked up, shown in FIG. 2. To begin with, the thin-film solar cell 10 having a defect 15 is placed on a loading stage 22 of a detection device 20. Then, the detection device 20 is connected with positive and negative electrodes of the thin-film solar cell 10 under test, respectively. The detection device 20 emits electroluminescent (EL) or infrared (IR) light onto the thin-film solar cell 10 so as to determine the actual location of the defect 15 in the thin-film solar cell 10. Afterward, the detection device 20 transmits the actual location of the defect 15 to a laser light device 24. The laser light device 24 then scribes the thin-film solar cell 10 with a laser light beam having a specific wavelength, thereby forming at least one isolation groove 16 having a closed-curve configuration around the defect 15. By so doing, the defect 15 of the thin-film solar cell 10 is effectively isolated or repaired to increase overall power generation efficiency of the thin-film solar cell 10. While laser light cutting is used for defect isolation in the present embodiment, mechanical cutting or chemical etching may also be used in the present invention for defect isolation as well.

Referred to FIG. 2, it is a method for defect isolation of a thin-film solar cell having a defect within the back electrode layer according to a second preferred embodiment of the present invention. More specifically, FIG. 2 is a sectional view of a thin-film solar cell 10. A laser light device 24 is provided to emit one of ultraviolet laser light, green laser light, and infrared laser light so as to partially remove a back electrode layer 14 along a closed curve centered around the defect 15. Thus, an isolation groove 16 having a closed-curve configuration is formed in the back electrode layer 14 to isolate the defect 15 of the thin-film solar cell 10. It is applicable that the light device 24 is provided to emit one of green laser light and infrared laser light to partially remove the back electrode layer 14 and absorber layer 13 along a closed curve centered around the defect 15 so as to from an isolation groove (not shown) having a depth extending from the back electrode layer 14 to the absorber layer 13. It is also applicable that the light device 24 is provided to emit infrared laser light to partially remove the back electrode layer 14, the absorber layer 13 and the front electrode layer 12 along a closed curve centered around the defect 15 so as to from an isolation groove (not shown) having a depth extending from the back electrode layer 14 through the absorber layer 13 to the front electrode layer 12.

When the isolation groove (not shown) has a depth extending from the back electrode layer 14 through the absorber layer 13 to the front electrode layer 12, and has a first groove width (not shown) in all three layers, it is applicable in case 1 to use one of ultraviolet laser light, green laser light, and infrared laser light of the laser light device 24 to subsequently partially remove the back electrode layer 14 along an edge of the isolation groove in the back electrode layer 14 such that the isolation groove has a newly second groove width (not shown) in the back electrode layer 14 greater than the first groove width in the absorber layer 13. Alternatively, it is also applicable in case2 to use one of green laser light and infrared laser light to partially remove both the back electrode layer 14 and the absorber layer 13 along an edge of the isolation groove in the back electrode layer 14 such that the isolation groove has two newly identical second groove widths respectively in the back electrode layer 14 and the absorber layer 13 greater than the first groove width in the front electrode layer 12.

According to the case1, it is also applicable to further use one of green laser light and infrared laser light to subsequently partially remove the absorber layer 13 adjacent to the edge of the isolation groove in the absorber layer 13 such that the isolation groove has a newly third groove width (not shown) in the absorber layer 13 greater than the first groove width in said front electrode layer.

In any case described above of the second preferred embodiment, the defect 15 of the thin-film solar cell 10 is isolated so as to repair the defect 15 due to restraining its short-circuit effect and further to increase the overall power generation efficiency of the thin-film solar cell 10.

A method according to a third preferred embodiment of the present invention for defect isolation of a thin-film solar cell having a defect within the absorber layer is shown in FIG. 3A and FIG. 3B, where FIG. 3A is a sectional view of a thin-film solar cell 10 having a defect 15 isolated by an isolation groove having a first structure, and FIG. 3B is a sectional view of a thin-film solar cell 10 having a defect 15 isolated by an isolation groove having a second structure. In the third preferred embodiment, a laser light device 24 is provided to emit infrared laser light so as to implement defect isolation along a closed curve centered around the defect 15 such that a back electrode layer 14, an absorber layer 13, and a front electrode layer 12 are all simultaneously partially removed to form an isolation groove 16 of having a closed-curve configuration and a depth extending from the back electrode layer 14 through the absorber layer 13 to the front electrode layer 12. It is also applicable that the isolation groove can be formed (not shown) by means of using one of ultraviolet laser light, green laser light and infrared laser light to partially removing the back electrode layer 14, or using one of green laser light and infrared laser light to partially removing the back electrode layer 14 and the absorber layer 13.

Referred back to FIG. 3A and FIG. 3B, after the isolation groove 16 is formed, subsequently using one of ultraviolet laser light, green laser light, and infrared laser light to partially remove the back electrode layer 14 around an edge of the formed isolation groove 16 in the back electrode layer 14 such that the isolation groove 16 has a newly groove width in the back electrode layer 14 greater than that in the absorber layer 13 (as shown in FIG. 3A), or using one of green laser light and infrared laser light to partially remove both the back electrode layer 14 and the absorber layer 13 around an edge of the formed isolation groove 16 in the back electrode layer 14 such that the isolation groove 16 has a newly groove width in the absorber layer 13 (and/or back electrode layer 14) greater than that in the front electrode layer 12 (as shown in FIG. 3B). Please note that it is allowable that the back electrode layer 14 has a new groove width different than that of the absorber layer 13. In any case described above of the third preferred embodiment, the defect 15 of the thin-film solar cell 10 is isolated so as to repair the defect 15 due to restraining its short-circuit effect and further to increase the overall power generation efficiency of the thin-film solar cell 10.

A method according to a fourth preferred embodiment of the present invention for defect isolation of a thin-film solar cell having a defect within a front electrode layer is shown in FIG. 4A and FIG. 4B, where FIG. 4A is a sectional view of a thin-film solar cell 10 having a defect 15 isolated by an isolation groove having a first structure, and FIG. 4B is a sectional view of a thin-film solar cell 10 having a defect 15 isolated by an isolation groove having a second structure. A laser light device 24 is provided to emit infrared laser light for scribing along a closed curve centered around the defect 15 of the thin-film solar cell 10, so that a back electrode layer 14, an absorber layer 13 and a front electrode layer 12 of the thin-film solar cell 10 are all simultaneously partially removed to form an isolation groove 16 with a closed-curve configuration and a depth extending from the back electrode layer 14 through the absorber layer 13 to the front electrode layer 12.

Subsequently, one of ultraviolet laser light, green laser light, and infrared laser light is emitted along an edge of the formed isolation groove 16 to partially remove the back electrode layer 14 adjacent to the edge such that the isolation groove 16 has a newly groove width in the back electrode layer 14 greater than that in the absorber layer 13, as shown in FIG. 4A.

Finally, one of green laser light and infrared laser light is emitted along an edge of the formed isolation groove 16 to further partially remove the absorber layer 13 adjacent to the edge such that the isolation groove 16 has a newly groove width in the absorber layer 13 greater than that in the front electrode layer 12, as shown in FIG. 4B. Please note that it is also applicable to partially remove both the back electrode layer 14 and the absorber layer 13 simultaneously such that the newly formed isolation groove 16 has an identical groove width respectively in the back electrode layer 14 and the absorber layer 13, and the identical groove width is greater than that in the front electrode layer 12. In any case described above of the fourth preferred embodiment, the defect 15 of the thin-film solar cell 10 is isolated.

In the first, second, third, and fourth preferred embodiments of the present invention, the groove width of each isolation groove ranges from 0.001 μm to 100000 μm, and the closed-curve configurations of the isolation grooves can be any one of a rectangle, a triangle, a polygon, a circle, an ellipse, or an island shape.

The present invention is described herein by reference to the preferred embodiments, and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A method for defect isolation of a thin-film solar cell, formed of a plurality of unit cells, wherein said thin-film solar cell comprises a substrate, a front electrode layer, an absorber layer and a back electrode layer sequentially stacked up, said method comprising steps of:
    detecting at least a defect of said thin-film solar cell so as to obtain a location of said defect;
    forming at least an isolation groove is centered around said defect with laser light based on said location of said defect, wherein said isolation groove has a closed-curve configuration to restrain a short circuit from said defect in said thin-film solar cell; and
    forming said isolation groove with a newly groove width, which partially removing said back electrode layer adjacent to an edge of said isolation groove in said back electrode layer, and said newly groove width of said isolation groove in said back electrode layer greater than that in said absorber layer.

2. The method of claim 1, wherein said location of said defect is in said back electrode layer.

3. The method of claim 1, further comprising partially removing said absorber layer adjacent to said edge of said isolation groove in said absorber layer, and said newly groove width of said isolation groove in said absorber layer greater than that in said front electrode layer.

4. The method of claim 1, wherein said closed-curve configuration of said isolation groove is selected from the group consisting of a rectangle, triangle, a polygon, a circle, an ellipse, and island shape.

5. A method for detect isolation a thin-film solar cell, said thin-film solar cell comprises a substrate, a front electrode layer, an absorber layer and a back electrode layer sequentially stacked up, said method comprising of:
    detecting at least a detect of said thin-film solar cell so as to obtain a location of said defect;
    forming at least an isolation groove is centered around said defect with laser light based on said location of said defect, wherein said isolation groove has a closed-curve configuration to restrain a short circuit from said defect in said thin-film solar cell; and
    forming said isolation with a newly groove width, which partially removing said absorber layer adjacent to an edge of said isolation groove in said back electrode, and said newly groove width of said isolation groove in said absorber layer greater than that in said front electrode layer.

6. The method of claim 5, wherein said location of said defect is in said absorber layer.

7. The method of claim 5, wherein said closed-curve configuration of said isolation groove is selected from the group consisting of a rectangle, a triangle, a polygon, a circle, an ellipse, and an island shape.

* * * * *